United States Patent
Bergendahl et al.

(10) Patent No.: US 8,896,067 B2
(45) Date of Patent: Nov. 25, 2014

(54) METHOD OF FORMING FINFET OF VARIABLE CHANNEL WIDTH

(71) Applicant: International Business Machines Corporation, Armonk, NY (US)

(72) Inventors: Marc Adam Bergendahl, Hopewell Junction, NY (US); David Vaclav Horak, Essex Junction, VT (US); Shom Ponoth, Gaithersburg, MD (US); Chih-Chao Yang, Glenmont, NY (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/736,111

(22) Filed: Jan. 8, 2013

(65) Prior Publication Data

US 2014/0191323 A1    Jul. 10, 2014

(51) Int. Cl.
*H01L 29/772* (2006.01)
*H01L 29/66* (2006.01)
*H01L 27/088* (2006.01)

(52) U.S. Cl.
CPC ...... *H01L 27/0886* (2013.01); *H01L 29/66484* (2013.01)
USPC ........... 257/368; 438/283; 438/294; 438/156; 438/585; 438/479

(58) Field of Classification Search
USPC ................. 257/368, 328, 197, E29.242, 327
See application file for complete search history.

(56) References Cited

U.S. PATENT DOCUMENTS

| | | | |
|---|---|---|---|
| 8,263,462 B2 | 9/2012 | Hung et al. | |
| 8,288,760 B2 | 10/2012 | Tezuka et al. | |
| 2002/0190343 A1 | 12/2002 | Jones, Jr. et al. | |
| 2003/0157772 A1 | 8/2003 | Wieczorek et al. | |
| 2004/0198001 A1 | 10/2004 | Chen et al. | |
| 2007/0221956 A1* | 9/2007 | Inaba | 257/197 |
| 2009/0057780 A1 | 3/2009 | Wong et al. | |
| 2009/0278196 A1* | 11/2009 | Chang et al. | 257/328 |
| 2010/0013017 A1 | 1/2010 | Tsutsui | |
| 2012/0083107 A1 | 4/2012 | Chang et al. | |

OTHER PUBLICATIONS

PCT Application No. PCT/US2014/010439 Filed: Jan. 7, 2014 PCT International Search Report and Written Opinion.

\* cited by examiner

*Primary Examiner* — Chuong A Luu
*Assistant Examiner* — Rodolfo Fortich
(74) *Attorney, Agent, or Firm* — Yuanmin Cai

(57) ABSTRACT

Embodiments of present invention provide a method of forming a first and a second group of fins on a substrate; covering a top first portion of the first and second groups of fins with a first dielectric material; covering a bottom second portion of the first and second groups of fins with a second dielectric material, the bottom second portion of the first group and the second group of fins having a same height; exposing a middle third portion of the first and second groups of fins to an oxidizing environment to create an oxide section that separates the top first portion from the bottom second portion of the first and second groups of fins; and forming one or more fin-type field-effect-transistors (FinFETs) using the top first portion of the first and second groups of fins as fins under gates of the one or more FinFETs.

13 Claims, 12 Drawing Sheets

METHOD OF FORMING FINFET OF VARIABLE CHANNEL WIDTH

FIELD OF THE INVENTION

The present invention relates generally to the field of semiconductor device manufacturing and in particular relates to method of forming fin-type field-effect-transistors with variable channel width.

BACKGROUND

In the field of semiconductor device manufacturing, many factors may affect the performance of a semiconductor device such as, for example, a field-effect-transistor (FET). For example, channel width of a FET may affect the total amount of electronic current that the FET is able to deliver or provide during operation. In reality, for various performance requirements, manufacturing of FETs of variable channel widths is often required or desirable, sometimes on a single chip and sometimes in a densely populated area to be placed next to each other, in order to fulfill particular combination of performances of the devices under manufacturing.

In a planar field-effect-transistor, changes of channel width are often accomplished by simply forming gate structures over substrate areas of different widths which ultimately become the channel widths of the devices. With recent advancement in semiconductor device manufacturing, fin-type field-effect-transistors (FinFETs) are becoming increasingly popular and common because of their advanced performance and ability of achieving high device density. Nevertheless, based upon current technology, channel widths of FinFETs are generally discretized. In other words, unlike a planar FET, widths of the fins over which gate structures of the FinFETs are normally formed are only allowed to have a limited number of different widths according to existing ground rules, which significantly limits the choices of design of devices, such as a static random access memory (SRAM) that may be manufactured. This is because designability, or choice of design, of a SRAM for example is at least partially based upon the ability of adjustment to the device width of different transistors used, such as pass gate (PG), pull-up (PU) and pull-down (PD) transistors.

SUMMARY OF EMBODIMENTS OF THE INVENTION

Embodiments of present invention provide a method of forming fin-type field-effect-transistors with different fin heights and thus different channel widths.

According to one embodiment, the method includes steps of forming a first and a second group of fins on a substrate; covering a top first portion of the first and second groups of fins with a first dielectric material; covering a bottom second portion of the first and second groups of fins with a second dielectric material with the bottom second portion of the first group of fins having a same height as the bottom second portion of the second group of fins; exposing a middle third portion of the first and second groups of fins to an oxidizing environment to create an oxide section that separates the top first portion from the bottom second portion of the first and second groups of fins; and forming one or more fin-type field-effect-transistors (FinFETs) using the top first portion of the first and second groups of fins as fins under gates of the one or more FinFETs.

In one embodiment, covering the top first portion of the first and second groups of fins includes covering the top first portion of the first group of fins of a height that is different from the top first portion of the second group of fins.

In another embodiment, covering the bottom second portion of the first and second groups of fins includes steps of depositing the second dielectric material on top of the substrate to cover the first and second groups of fins; and uniformly recessing the second dielectric material and causing the second dielectric material to cover a same height of the bottom second portion of the first and second groups of fins.

In yet another embodiment, top surfaces of the first and second groups of fins are covered by a hard mask layer, and covering the top first portion of the first and second groups of fins includes the steps of forming spacers of the first dielectric material directly next to sidewalls of the top first portion of the first and second groups of fins that are not covered by the second dielectric material; and causing the spacers and the hard mask layer to form dielectric covers over the top first portion of the first and second groups of fins.

In one embodiment, exposing the middle third portion of the first and second groups of fins to an oxidizing environment includes the steps of recessing the second dielectric material to expose the middle third portion of the first and second groups of fins that are next to the top first portion and the bottom second portion of the first and second groups of fins and are previously covered by the second dielectric material; and causing the middle third portion to be oxidized to insulate the top first portion from the bottom second portion of the first and second groups of fins.

According to another embodiment, the method further includes the steps of removing the first dielectric material to expose the top first portion of the first and second groups of fins; depositing a layer of high dielectric constant (high-k) material covering the exposed top first portion of the first and second groups of fins; and forming one or more gate structures, of the one or more FinFETs, on top of the layer of high-k dielectric material and crossing the top first portion of the first and second groups of fins.

In one embodiment, covering the top first portion of the first and second groups of fins includes the steps of depositing a layer of the second dielectric material on top of the substrate and the first and second groups of fins; applying a first selective etching process to recess the layer of the second dielectric material to expose the top first portion of the first group of fins and a corresponding portion of the second group of fins; covering a portion of the recessed layer of the second dielectric material surrounding the first group of fins while leaving rest of the recessed layer of the second dielectric material uncovered; applying a second selective etching process to further recess the rest of the recessed layer of the second dielectric material to expose the top first portion of the second group of fins; and forming spacers directly next to sidewalls of the first and second groups of fins.

In another embodiment, covering the bottom second portion of the first and second groups of fins further includes the steps of, after forming the spacers directly next to sidewalls of the first and the second groups of fins, depositing a sacrificial dielectric layer on top of the recessed layer of the second dielectric material, the sacrificial dielectric layer being materially substantially same as the recessed layer of the second dielectric material; applying a chemical-mechanic-polishing (CMP) process to create a flat top surface of the sacrificial dielectric layer; and selectively etching the sacrificial dielectric layer and underneath the recessed layer of the second dielectric material in creating a layer of the second dielectric material of uniform thickness covering the bottom second portion of the first and second groups of fins.

Embodiments of present invention also provide a semiconductor structure, which includes a first group of fin-type field-effect-transistors (FinFETs) having a first group of fins of a first height with the first group of fins being on top of a first group of oxide sections; and a second group of FinFETs having a second group of fins of a second height that is different from the first height with the second group of fins being on top of a second group of oxide sections, wherein the first group of oxide sections has a first bottom level and the second group of oxide sections has a second bottom level that is at a same level as the first bottom level.

BRIEF DESCRIPTION OF THE DRAWINGS

The present invention will be understood and appreciated more fully from the following detailed description of preferred embodiments, taken in conjunction with the accompanying drawings of which.

Figure 1:
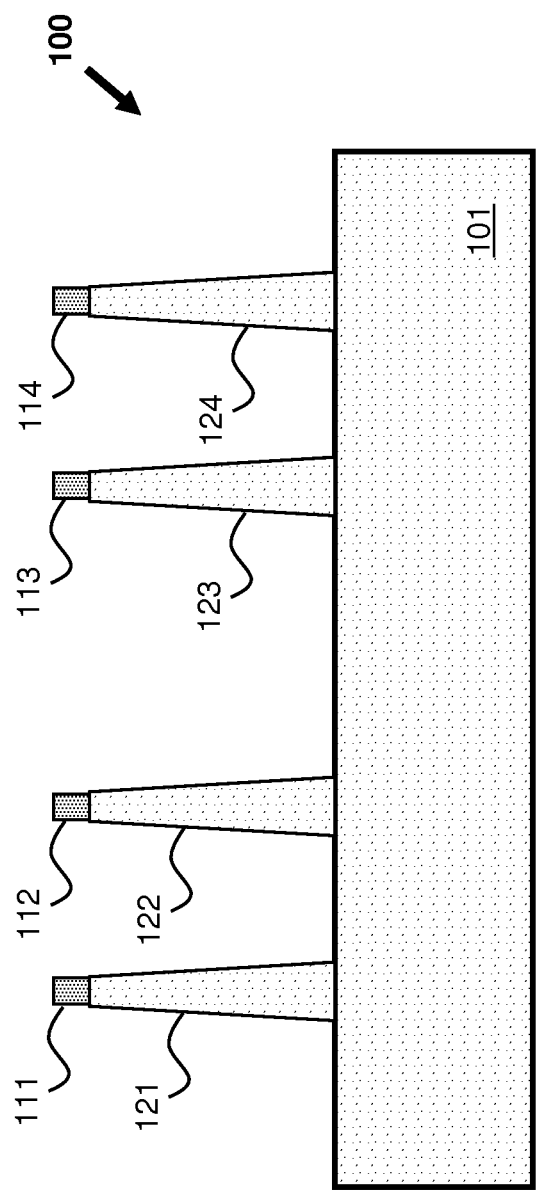
FIG. 1 is a demonstrative cross-sectional illustration of fin-type field-effect-transistors with variable channel widths in a method of forming thereof according to an embodiment of the present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative cross-sectional illustration of fin-type field-effect-transistors with variable channel widths in a method of forming thereof according to an embodiment of the present invention. More specifically, embodiments of present invention provide a method of forming a FinFET with the ability of adjusting channel width during the process of manufacturing thereof. Embodiments of present invention also provide a method of forming one or more FinFETs with one or more different channel widths that may be suitable or desirable for the FinFETs formed. In order to provide variable and/or different channel widths, embodiments of present invention provide a method of controlling the height of respective fins which effectively affect and/or determine the channel widths of the FinFETs formed.

More specifically, one embodiment of the method may start with forming one or more fin structures, such as fins 121, 122, 123, and 124 on (or in) a substrate 101 as in FIG. 1. Substrate 101 may be a semiconductor substrate suitable for forming transistors and in particular forming fin-type field-effect-transistors thereupon. As some non-limiting examples, substrate 101 may be a silicon substrate, a germanium-doped silicon substrate, a strained silicon substrate, a substrate with buried oxide (BOX), or a substrate with strained silicon directly on insulator (SSDOI). Other types of substrate may be used as well.

Fins 121-124 may be made of conductive or semiconductor materials, such as silicon (Si), and may be formed through the use of a selective etching process with the help of protective hard masks 111, 112, 113, and 114 on top thereof which have the pattern of fins to be formed. Hard masks 111-114 may be made of a dielectric material such as nitride or oxide and in particular may be selectively made of a material different from that of fins 121-124 such that they are able to withstand the selective etching process of fins 121-124. Fins 121-124 may be formed directly from substrate 101 by, for example, etching a top portion of substrate 101 into the shapes of fins 121-124, but embodiments of present invention are not limited in this aspect. For example, in another embodiment, fins 121-124 may be formed by initially depositing a conductive or semiconductor layer of material on top of substrate 101 and subsequently patterning the deposited conductive or semiconductor layer into fins 121-124.

Fins 121-124 may include one or more groups of fins such as a first group of fins 121-122 and a second group of fins 123-124, for forming different types of FinFETs with different channel widths which may be collectively referred to hereinafter as device 100. The height of fins 121-124 may be made sufficiently high, as may be deemed necessary, in order to form different types of FinFETs of different widths later. Moreover, fins 121-124 may be formed to have substantially vertical sidewalls, as being generally preferred, but certain level of slopes may be inevitable, due to any particular etching process being used, and is acceptable as well.

Figure 2:
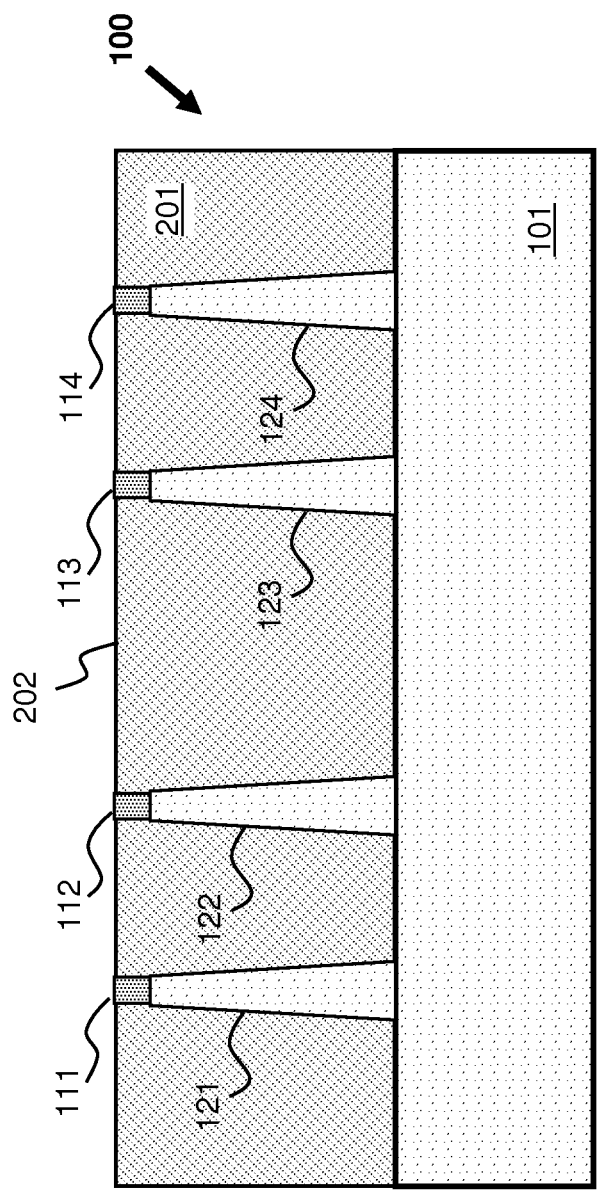
FIG. 2 is a demonstrative cross-sectional illustration of fin-type field-effect-transistors with variable channel widths in a method of forming thereof, following a step illustrated in FIG. 1, according to an embodiment of the present invention.

FIG. 2 is a demonstrative cross-sectional illustration of fin-type field-effect-transistors with variable channel widths in a method of forming thereof, following a step illustrated in FIG. 1, according to an embodiment of the present invention. More specifically, according to one embodiment, the method may include forming a dielectric layer to cover fins 121-124, or at least a bottom portion thereof. For example, in FIG. 2, a dielectric layer 201 may be formed or deposited to completely cover fins 121-124 as well as hard masks 111-114 on top thereof. In order to do so, dielectric layer 201 may be formed or deposited to have an initial height higher than that of hard masks 111-114. Dielectric layer 201 may then be recessed down or polished, for example through a chemical-mechanic-polishing (CMP) process using hard masks 111-114 as end-point indicator during the CMP process, to create a flat top surface 202. The creation of flat top surface 202 ensures that dielectric layer 201, when being subsequently processed to lower a height of at least a portion thereof that surrounds one or more groups of fins, may still have a substantially same height for the portion whose height is lowered because they will be derived from a same starting height as illustrated in FIG. 2. In fact, for the purpose of the above, in one embodiment, flat top surface 202 may be made above the level of hard masks 111-114.

Figure 3:
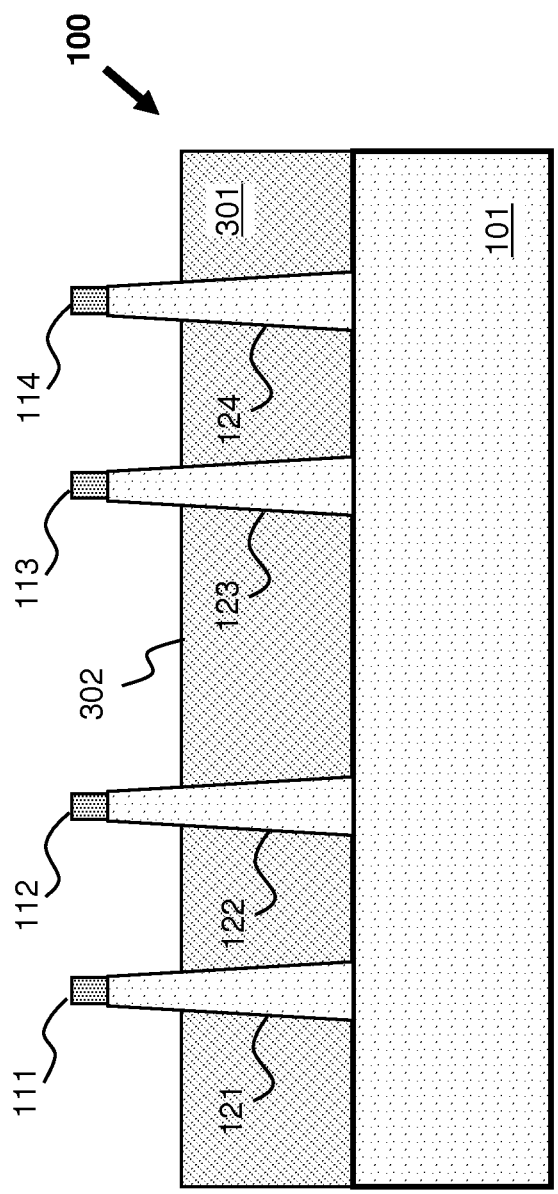
FIG. 3 is a demonstrative cross-sectional illustration of fin-type field-effect-transistors with variable channel widths in a method of forming thereof, following a step illustrated in FIG. 2, according to an embodiment of the present invention.

FIG. 3 is a demonstrative cross-sectional illustration of fin-type field-effect-transistors with variable channel widths in a method of forming thereof, following a step illustrated in FIG. 2, according to an embodiment of the present invention. More specifically, dielectric layer 201 in FIG. 2 may be recessed down, for example through a reactive-ion-etching (RIE) process, to expose at least a top portion of fins 121-124. The remaining dielectric layer, denoted as dielectric layer 301 in FIG. 3, may cover a bottom portion of fins 121-124 and may have a substantially uniform height 302 that is lower than the height of fins 121-124. The RIE process of recessing dielectric layer 201 may be selective to material of dielectric layer 201, and may not etch or at least not substantially or noticeably etch either fins 121-124 or hard masks 111-114 on top thereof. The selective etching process may be made possible through careful selection of use of different materials for the fins, hard masks, and for the dielectric layer. For example, oxide material may be used for dielectric layer 201 such that it is etch-selective, under certain etchant and etch conditions, to material of hard masks 111-114 of nitride and fins 121-124 of, for example, silicon.

As being described above with regard to FIG. 2, in one embodiment, dielectric layer 301 may be formed directly by depositing dielectric material of, for example, oxide on top of substrate 101 to cover only the bottom portion of fins 121-124. In other words, dielectric layer 201 may be deposited to a pre-determined height or desired height to serve directly as dielectric layer 301, should top surface 302 formed thereby have a variation of height that is substantially small to not become a concern in forming FinFETs with different height of fins and so different channel widths, as being described below in more detail. In the case that some dielectric material may be deposited around the fins, during the deposition of dielectric layer 301, they may be selectively removed through a short selective etching process, as being compared to a relatively long etching process that may require starting from the structure illustrated in FIG. 2. The height of dielectric layer 301 may be decided by the amount of fins to be exposed on top thereof, which in turn may be determined by a pre-determined fin height that is to be used for forming the FinFETs. For example, the height of dielectric layer 301 may be determined by the height of the first group of fins 121 and 122 that may be used for forming a first group of FinFETs.

Figure 4:
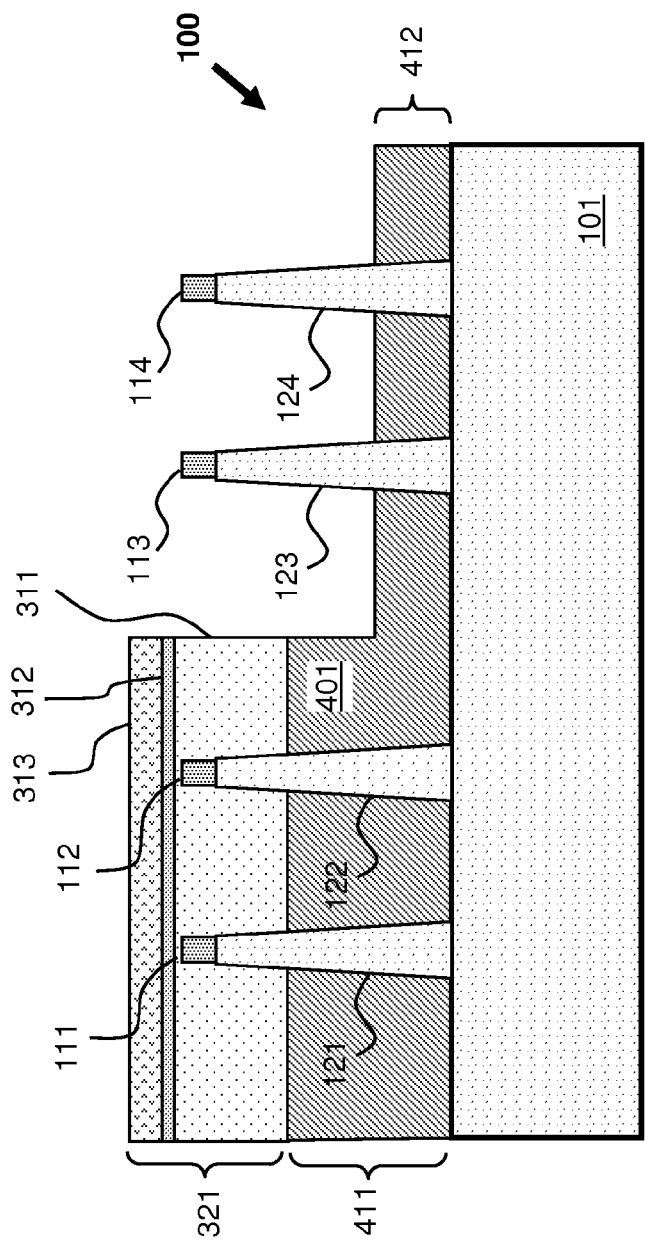
FIG. 4 is a demonstrative cross-sectional illustration of fin-type field-effect-transistors with variable channel widths in a method of forming thereof, following a step illustrated in FIG. 3, according to an embodiment of the present invention.

FIG. 4 is a demonstrative cross-sectional illustration of fin-type field-effect-transistors with variable channel widths in a method of forming thereof, following a step illustrated in FIG. 3, according to an embodiment of the present invention. After forming dielectric layer 301, in one embodiment, different areas of dielectric layer 301 may be processed to have different heights in order to form FinFETs of different fin heights in the respective different areas, and thus realizing different channel widths. For example, the first group of fins 121-122 and the second group of fins 123-124 may be formed to have different exposed heights to form different groups of FinFETs of different channel widths.

In a process of achieving the above, a mask 321 may be formed to cover a portion of dielectric layer 301 that surrounds first group of fins 121-122. More specifically, an organic planarization layer (OPL) 311 may be applied on top of dielectric layer 301 first to create a planarized surface. An anti-reflective coating (SiARC) layer 312 may then be applied on top of OPL layer 311 and subsequently a photo resist layer 313 may be applied, such as through a spin-on process, on top of the SiARC layer 312. The photo resist layer 313, as well as the SiARC layer 312 and OPL layer 311 underneath thereof, may be patterned through a standard photolithographic patterning process to create mask 321 covering only the portion of dielectric layer 301 that surrounds first group of fins 121-122. The rest of dielectric layer 301 may then be subjected to a directional and selective etching process to further lower the height thereof. As a result, dielectric layer 301 may be processed to become dielectric layer 401, having two distinctive areas of a first height 411 of a first area surrounding the first group of fins 121-122 and a second height 412 of a second area surrounding the second group of fins 123-124. After the formation of different heights of different areas of dielectric layer 401, mask 321 (including the OPL layer 311, the SiARC layer 312, and the photo resist layer 313) may be removed or lifted off through any known or future developed technique, leaving the first top portion of fins 121-124 exposed at their sidewalls. In the meantime, the top surfaces of fins 121-124 are covered by hard masks 111-114.

As being demonstratively illustrated in FIG. 4, embodiments of present invention as being described above provide a method of forming dielectric layer 401 to surround and cover a different amount of portions of different groups of fins, resulting in different heights of different groups of fins being exposed above the level above dielectric layer 401. According to one embodiment of present invention, the exposed fins may be designed to have a height that is substantially close to that of fins to be used to form one or more different groups of FinFETs. Furthermore, the formation of dielectric layer 401 of different heights at different areas may be achieved according to other embodiments of present invention, one of which is described below in more details.

Figure 11:
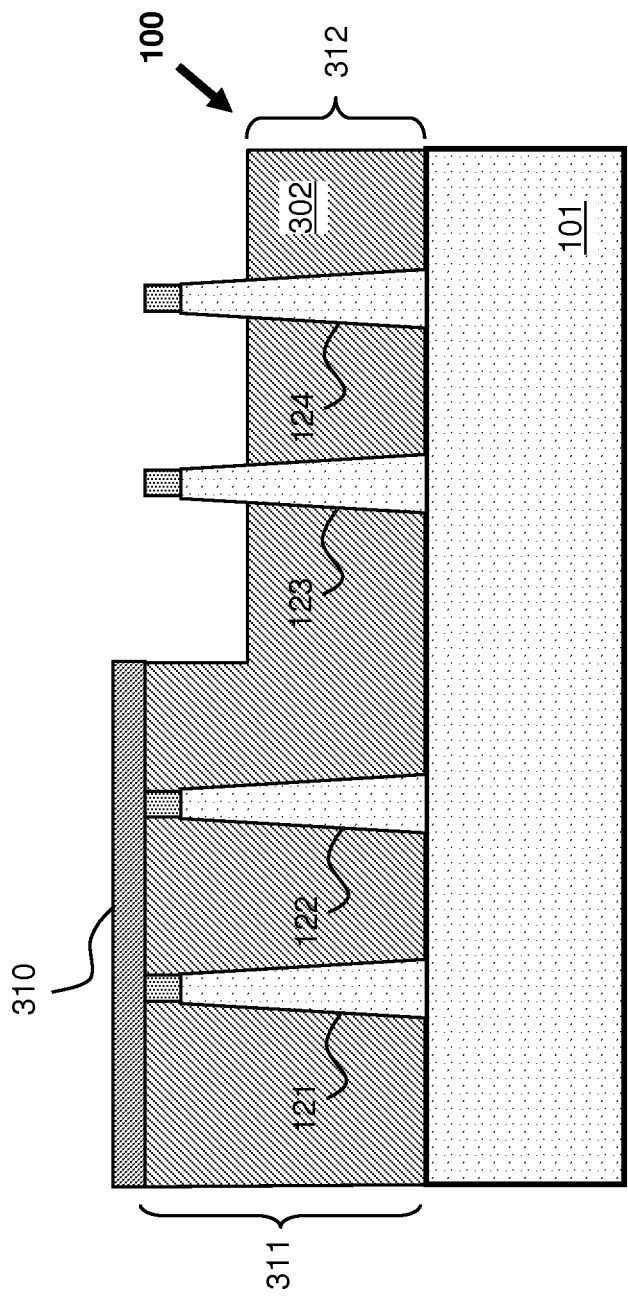
FIG. 11 is a demonstrative cross-sectional illustration of fin-type field-effect-transistors with variable channel widths in a method of forming thereof according to another embodiment of the present invention, following a step illustrated in FIG. 2.

Reference is briefly made to FIG. 11, which is a demonstrative cross-sectional illustration of fin-type field-effect-transistors with variable channel widths in a method of forming thereof according to another embodiment of the present invention, following a step illustrated in FIG. 2. In order to form a dielectric layer that has different heights to surround different groups of fins, after a flat top surface of dielectric layer 201 is formed as in FIG. 2, a photo-resist mask 310 may be formed to cover a portion of dielectric layer 201 that surrounds the first group of fins 121-122. A directional and selective etching process may then be applied to recess rest of the dielectric layer 201 that are not covered by mask 310. The etching process may create a processed dielectric layer 302 that has a height difference between a first portion of a first height 311 and a second portion of a second height 312. The amount of etching, and thereby the amount of difference in height between the two areas, may be adjusted based upon design and performance requirements of the two corresponding groups of FinFETs to be formed. Further, when being compared with the embodiment illustrated in FIG. 3 and FIG. 4, mask 310 used in the present embodiment may be simpler because dielectric layer 201 has a flat top surface and thus no OPL layer is needed. In other words, photo resist mask 310 may be formed directly on top of dielectric layer 210 with optionally an anti-reflective coating underneath thereof to improve patterning process.

Figure 12:
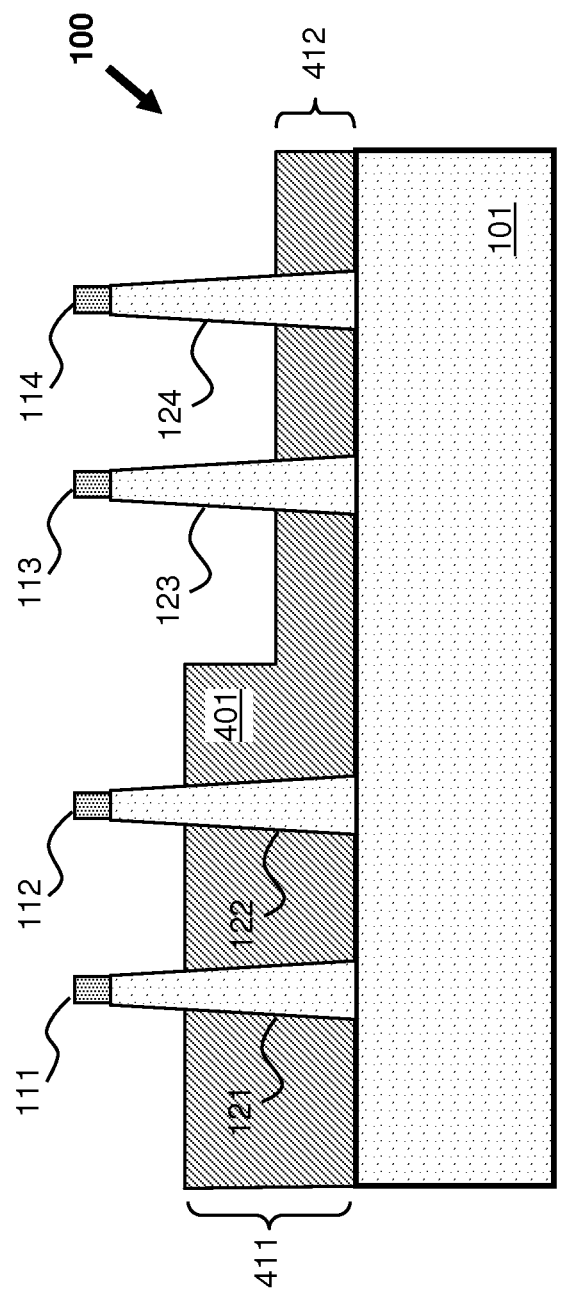
FIG. 12 is a demonstrative cross-sectional illustration of fin-type field-effect-transistors with variable channel widths in a method of forming thereof according to another embodiment of the present invention, following a step illustrated in FIG. 11.

Reference is further made to FIG.12, which is a demonstrative cross-sectional illustration of fin-type field-effect-transistors with variable channel widths in a method of forming thereof according to another embodiment of the present invention, following a step illustrated in FIG. 11. After the creation of dielectric layer 302 having difference in height at different areas, the photo-resist mask 310 may be removed and dielectric layer 302 may be further subjected to a selective etching process to lower down both height 411 and height 412 in the first and second areas, respectively, that surrounds the first group 121-122 and the second group 123-124 of fins respectively. The process eventually leads to a structure of dielectric layer 401 that is similar to that as being demonstratively illustrated in FIG. 4.

Figure 5:
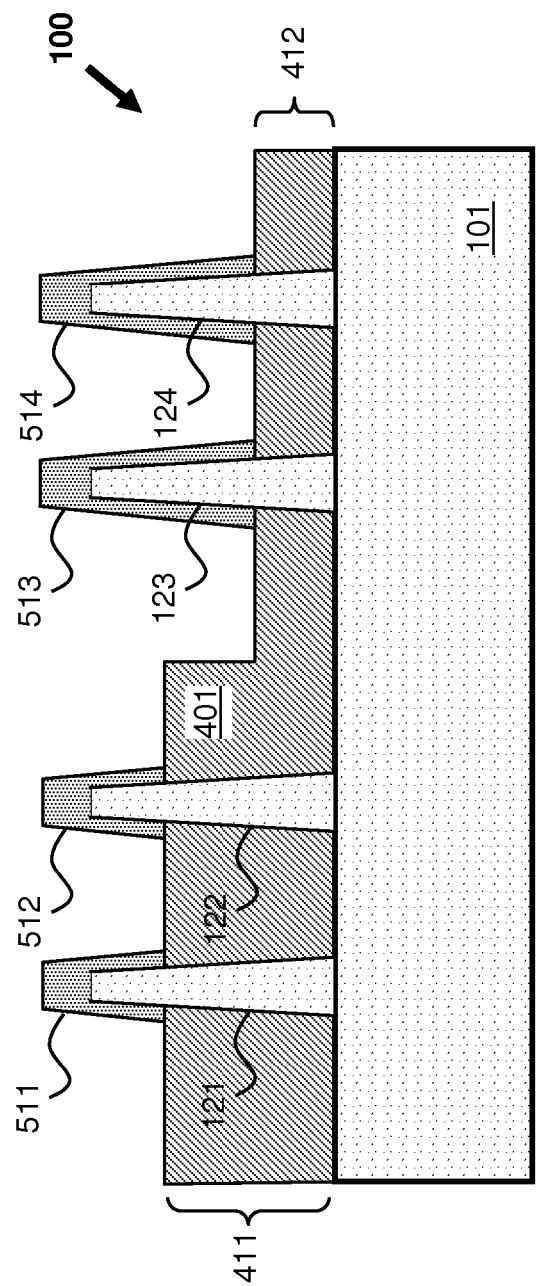
FIG. 5 is a demonstrative cross-sectional illustration of fin-type field-effect-transistors with variable channel widths in a method of forming thereof, following a step illustrated in FIG. 4, according to an embodiment of the present invention.

Reference is made back FIG. 5, which is a demonstrative cross-sectional illustration of fin-type field-effect-transistors with variable channel widths in a method of forming thereof, following a step illustrated in FIG. 4, according to an embodiment of the present invention. More specifically, with different amount of top portions of fins 121-124 being exposed, top surfaces thereof being covered by hard masks 111-114, and rest thereof being covered by dielectric layer 401, one embodiment of present invention includes forming sidewall spacers of dielectric material covering sidewalls of the exposed portions of fins 121-124. Materials of the sidewall spacers may be made same as hard masks 111-114 but may be made different from that of dielectric layer 401 in order to facilitate a follow-up selective etching process as being described below in more detail. For example, when dielectric layer 401 is made of oxide, sidewall spacers may be made of nitride. Sidewall spacers may be formed by first depositing a preferably conformal nitride layer covering both dielectric layer 401 and all of the exposed surfaces of fins 121-124. The conformal dielectric layer may then be subjected to a directional etching process to remove majority thereof, leaving only portions that are next to sidewalls of the exposed fins to cover the exposed fins of different heights. Hard masks 111-114 or at least a portion of thereof may also remain at the top of fins 121-124 after the directional etching process. Hereinafter, sidewall spacers formed at sidewalls of fins 121-124 and hard masks 111-114 on top thereof may collectively be referred to as dielectric covers 511-514, as being demonstratively illustrated in FIG. 5.

Figure 6:
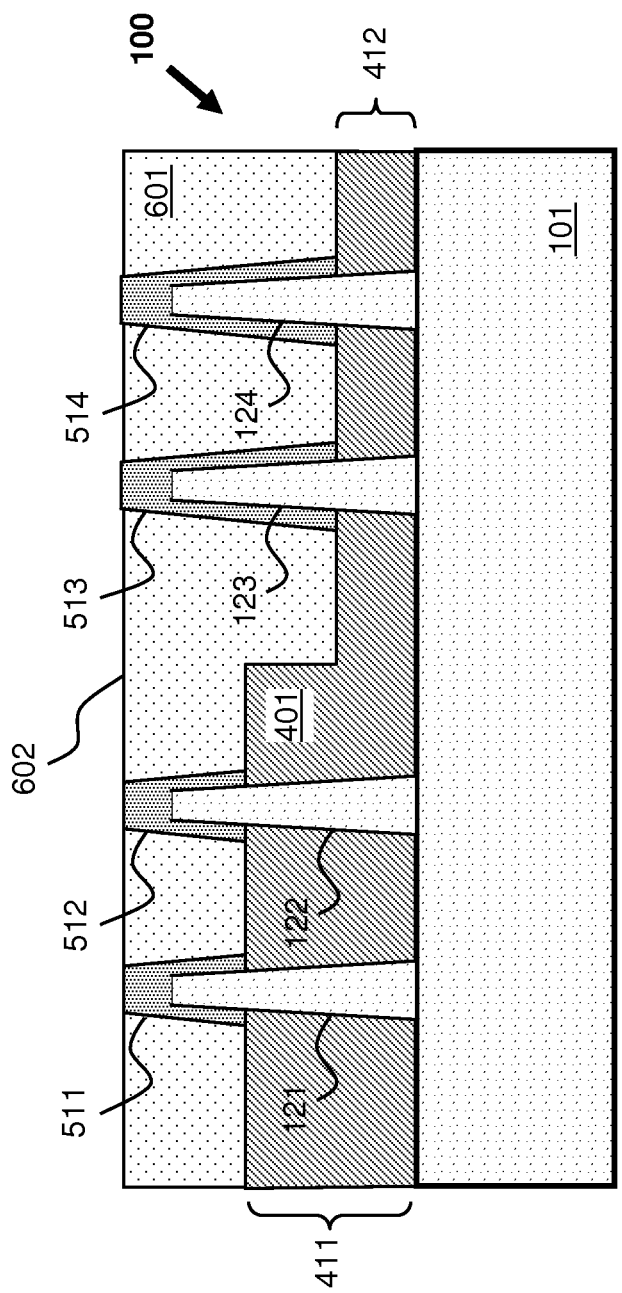
FIG. 6 is a demonstrative cross-sectional illustration of fin-type field-effect-transistors with variable channel widths in a method of forming thereof, following a step illustrated in FIG. 5, according to an embodiment of the present invention.

FIG. 6 is a demonstrative cross-sectional illustration of fin-type field-effect-transistors with variable channel widths in a method of forming thereof, following a step illustrated in FIG. 5, according to an embodiment of the present invention. More specifically, with portions of fins 121-124 above the level of dielectric layer 401 being covered by dielectric covers 511-514 of dielectric material different from that of dielectric layer 401, one embodiment of present invention includes re-filling the spaces between fins 121-124 with a same, or significantly same, dielectric material as that of dielectric layer 401 to form dielectric layer 601. In particular, material that is used to form dielectric layer 601 may be selected to have a significantly same etch rate, in a follow-up selective etch process, as that of dielectric layer 401. The re-filling of spaces between fins 121-124 may be made to a level above the top level of fins 121-124 covered by hard masks 511-514, and may subsequently be lowered down by applying a CMP process to become dielectric layer 601, which in thickness complements a topography of underneath dielectric layer 401 and has a flat top surface 602.

Figure 7:
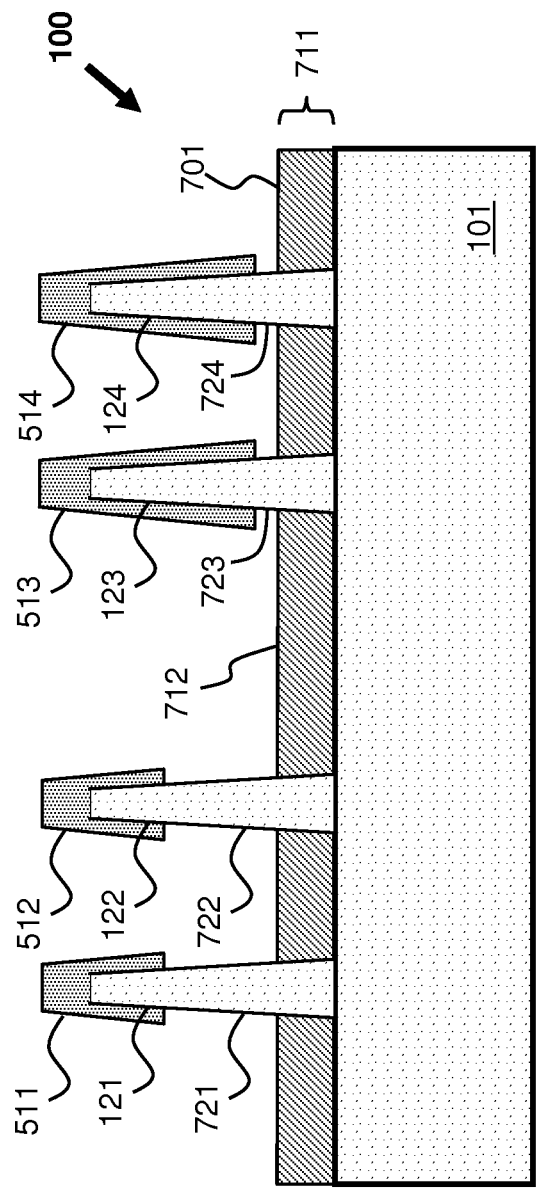
FIG. 7 is a demonstrative cross-sectional illustration of fin-type field-effect-transistors with variable channel widths in a method of forming thereof, following a step illustrated in FIG. 6, according to an embodiment of the present invention.

FIG. 7 is a demonstrative cross-sectional illustration of fin-type field-effect-transistors with variable channel widths in a method of forming thereof, following a step illustrated in FIG. 6, according to an embodiment of the present invention. More specifically, with portions of fins 121-124 now being embedded inside dielectric layer 601 and covered by dielectric covers 511-514 of material that is different from that of dielectric layer 601, one embodiment of present invention includes applying a recessing process to partially expose fins 121-124. The recessing process may remove all of dielectric layer 601 as well as a portion of dielectric layer 401 that surrounds the first group of fins 121-122. The recessing process may be made selective such that both fins 121-124 and dielectric covers 511-514 on top thereof may not be affected or at least not significantly affected or etched. As a result, the recessing process expose a middle portion of the respective fins 121-124 that are previously covered by dielectric layer 401. In other words, the recessing process creates middle sections 721-724 of their respective fins 121-124, resulting in a top first portion of fins 121-124 that are covered by dielectric covers 511-514, a bottom second portion that are covered by dielectric layer 701, and a middle third portion 721-724 that are exposed and are neither covered by sidewall spacers 511-514 nor covered by dielectric layer 701. A top level of the middle third portion 721-724 may be at different vertical positions or locations of their respective fins 121-124 for different groups of fins, but a bottom level may be the same, which is now determined by the remaining dielectric layer 401 which is now dielectric layer 701. The remaining portion of dielectric layer 701 has a thickness 711 and a top flat surface 712.

Figure 8:
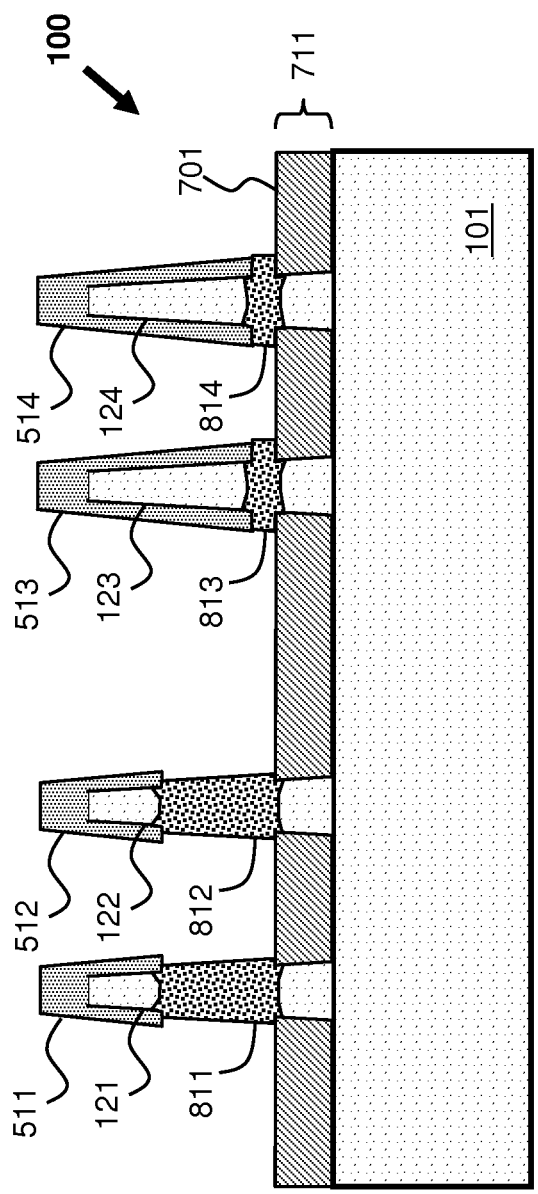
FIG. 8 is a demonstrative cross-sectional illustration of fin-type field-effect-transistors with variable channel widths in a method of forming thereof, following a step illustrated in FIG. 7, according to an embodiment of the present invention.

FIG. 8 is a demonstrative cross-sectional illustration of fin-type field-effect-transistors with variable channel widths in a method of forming thereof, following a step illustrated in FIG. 7, according to an embodiment of the present invention. More specifically, with the rest portions of fins 121-124 being covered either by nitride of dielectric covers 511-514 or by oxide of dielectric layer 701, one embodiment of present invention may include subjecting the exposed middle portion 721-724 of fins 121-124 to an oxidizing environment and/or process to create oxide sections 811-814, in each of the respective fins 121-124, by transforming the underlining materials of exposed portion of fins into an insulating material such as, for example, an oxide. The insulating or oxide sections 811-814 thus separate and therefore isolate the top first portions from the bottom second portions of fins 121-124.

During the oxidization process, there may be some volume changes associated therewith in the oxidized sections as being demonstratively illustrated in FIG. 8. According to one embodiment of present invention, while the bottom second portions of fins 121-124 are embedded in dielectric layer 701, the top first portions of fins 121-124 may be used to form FinFETs, as fins underneath gates.

Figure 9:
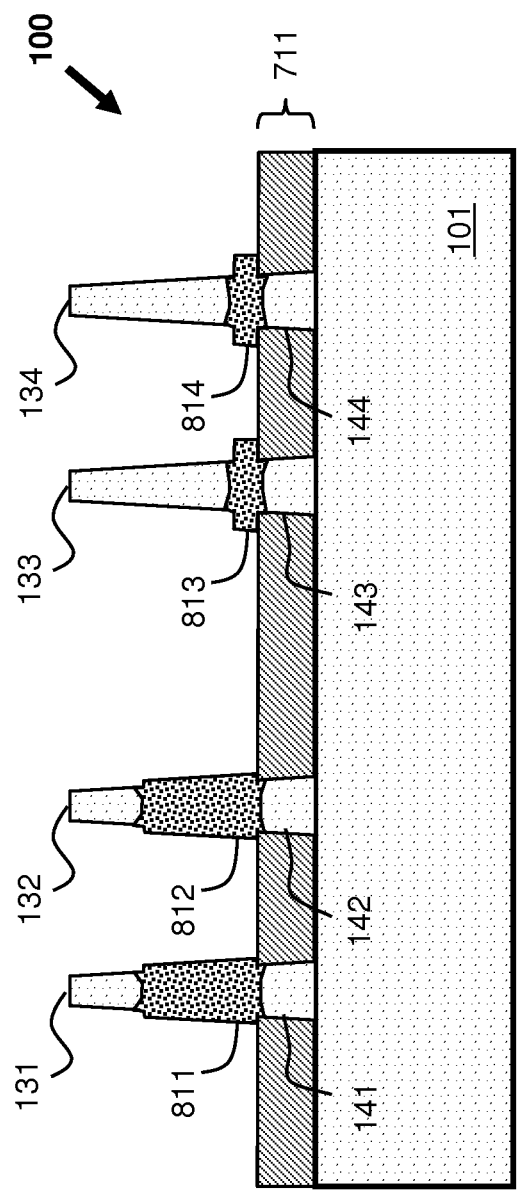
FIG. 9 is a demonstrative cross-sectional illustration of fin-type field-effect-transistors with variable channel widths in a method of forming thereof, following a step illustrated in FIG. 8, according to an embodiment of the present invention.

FIG. 9 is a demonstrative cross-sectional illustration of fin-type field-effect-transistors with variable channel widths in a method of forming thereof, following a step illustrated in FIG. 8, according to an embodiment of the present invention. More specifically, one embodiment of present invention may include removing dielectric covers 511-514 that covers the top first portions of fins 121-124. In FIG. 9, fins 121-124 are now illustrated to be consist of top first portions of 131, 132, 133, and 134, bottom second portions of 141, 142, 143, and 144, and middle third portions 811, 812, 813, and 814, while middle second portions 811-814 situates atop of flat top surface 702 of dielectric layer 701. Hereinafter, since the top first portion 131-134 of fins 121-124 are used to form FinFETs, they may be referred to, in short, as fins 131-134 for simplicity.

Figure 10:
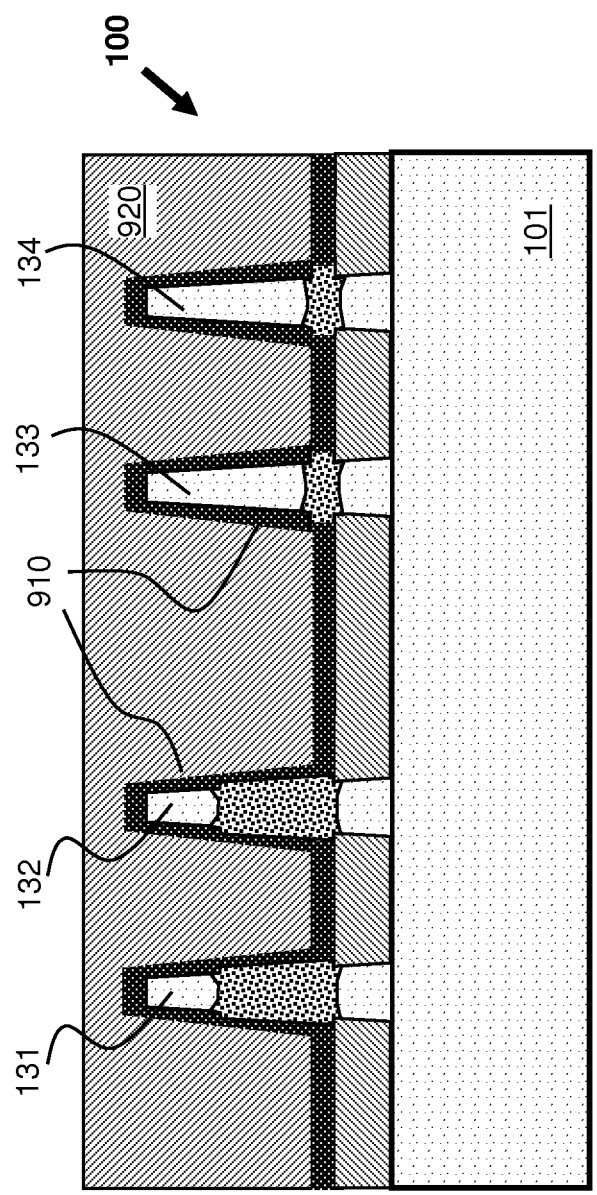
FIG. 10 is a demonstrative cross-sectional illustration of fin-type field-effect-transistors with variable channel widths in a method of forming thereof, following a step illustrated in FIG. 9, according to an embodiment of the present invention.

FIG. 10 is a demonstrative cross-sectional illustration of fin-type field-effect-transistors with variable channel widths in a method of forming thereof, following a step illustrated in FIG. 9, according to an embodiment of the present invention. More specifically, having formed fins 131-134 of different heights with a same top height level and different bottom levels, other process steps of forming FinFETs may follow. For example, one embodiment of present invention includes depositing a gate dielectric layer 910 to cover exposed surfaces of fins 131-134. Following the deposition of gate dielectric layer 910, other well-known and established processing steps, including both the gate-first and the gate-last processes, may be applied to form transistors on top of fins 131-134. For example in a gate-first process, a gate structure 920 may be formed across fins 131-134 on top of gate dielectric layer 910; sidewall spacers may be formed in locations next to gate structure 920; source/drain may be epitaxially formed from top of substrate 101 next to gate structure 920; and contacts to source, drain, and/or gate may be formed. Further for example, in a gate-last process or a replacement-gate or replacement-metal-gate (RMG) process, a dummy gate may be formed first on top of fins 131-134 and later removed and replaced with a working gate structure after rest of the transistor structure, including the source/drain, have been formed or created.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   forming a first and a second group of fins on a substrate;
   covering a top first portion of said first and second groups of fins with a first dielectric material by forming spacers of said first dielectric material directly next to sidewalls of said top first portion of said first and second groups of fins;
   covering a bottom second portion of said first and second groups of fins with a second dielectric material, said second dielectric material being uniformly recessed to cause said bottom second portion of said first group of fins having a same height as said bottom second portion of said second group of fins;
   exposing a middle third portion of said first and second groups of fins to an oxidizing environment to create an oxide section that separates said top first portion from said bottom second portion of said first and second groups of fins; and
   forming one or more fin-type field-effect-transistors (FinFETs) using said top first portion of said first and second groups of fins as fins under gates of said one or more FinFETs.

2. The method of claim 1, wherein covering said top first portion of said first and second groups of fins comprises covering said top first portion of said first group of fins of a height that is different from said top first portion of said second group of fins.

3. The method of claim 1, wherein exposing said middle third portion of said first and second groups of fins to an oxidizing environment comprises:
   recessing said second dielectric material to expose said middle third portion of said first and second groups of fins that are next to said top first portion and said bottom second portion of said first and second groups of fins and are previously covered by said second dielectric material; and
   causing said middle third portion to be oxidized to insulate said top first portion from said bottom second portion of said first and second groups of fins.

4. The method of claim 1, further comprising:
   removing said first dielectric material to expose said top first portion of said first and second groups of fins;
   depositing a layer of high dielectric constant (high-k) material covering said exposed top first portion of said first and second groups of fins; and
   forming one or more gate structures, of said one or more FinFETs, on top of said layer of high-k dielectric material and crossing said top first portion of said first and second groups of fins.

5. The method of claim 1, wherein covering said top first portion of said first and second groups of fins comprises:
   depositing a layer of said second dielectric material on top of said substrate and said first and second groups of fins;
   applying a first selective etching process to recess said layer of said second dielectric material to expose said top first portion of said first group of fins and a corresponding portion of said second group of fins;
   covering a portion of said recessed layer of said second dielectric material surrounding said first group of fins, leaving rest of said recessed layer of said second dielectric material uncovered;
   applying a second selective etching process to further recess said rest of said recessed layer of said second dielectric material to expose said top first portion of said second group of fins; and
   forming spacers directly next to sidewalls of said first and second groups of fins.

6. The method of claim 5, wherein covering said bottom second portion of said first and second groups of fins further comprises, after forming said spacers directly next to sidewalls of said first and said second groups of fins:
   depositing a sacrificial dielectric layer on top of said recessed layer of said second dielectric material, said sacrificial dielectric layer being materially substantially same as said recessed layer of said second dielectric material;

applying a chemical-mechanic-polishing (CMP) process to create a flat top surface of said sacrificial dielectric layer; and selectively etching said sacrificial dielectric layer and underneath said recessed layer of said second dielectric material in creating a layer of said second dielectric material of uniform thickness covering said bottom second portion of said first and second groups of fins.

7. A method comprising:

forming a set of fins on a substrate, said set of fins having a top first portion, a bottom second portion, and a middle third portion directly underneath said top first portion and directly above said bottom second portion;

oxidizing said middle third portion to create an oxide section in each of said set of fins, said oxide section comprising a first group thereof, having a first bottom and a first height and corresponding to a first group of said set of fins, and a second group thereof, having a second bottom and a second height and corresponding to a second group of said set of fins, said first bottom having a same height as said second bottom and said first height being higher than said second height; and applying said top first portion of said set of fins in forming one or more fin-type field-effect-transistors (FinFETs), wherein oxidizing said middle third portion comprises:
covering said top first portion by forming spacers of a first dielectric material directly next to sidewalls of said set of fins;
recessing a second dielectric material surrounding said set of fins to expose said middle third portion of said set of fins; and
subjecting said exposed middle third portion to an oxidizing environment.

8. The method of claim 7, further comprising causing said middle third portion of said set of fins to insulate said top first portion from said bottom second portion of said set of fins.

9. The method of claim 7, further comprising:
removing said first dielectric material that covers said top first portion of said set of fins;
depositing a layer of high dielectric constant (high-k) material covering said exposed top first portion of said set of fins; and
forming one or more gate structures, of said one or more FinFETs, crossing said set of fins on top of said layer of high-k dielectric material.

10. The method of claim 7, wherein covering said top first portion of said set of fins comprises covering said top first portion of a first height of said first group of said set of fins and covering said top first portion of a second height of said second group of said set of fins with said first dielectric material, wherein said second height of said top first portion of said second group of said set of fins being higher than said first height of said top first portion of said first group of said set of fins.

11. The method of claim 10, wherein covering said top first portion of said set of fins comprises:
depositing a layer of said second dielectric material on top of said substrate and said set of fins;
applying a first selective etching process to recess said layer of said second dielectric material to expose said top first portion of said first group of said set of fins and a corresponding portion of said second group of said set of fins;
covering a portion of said recessed layer of said second dielectric material surrounding said first group of said set of fins, leaving rest of said recessed layer of said second dielectric material uncovered; and
applying a second selective etching process to further recess said rest of said recessed layer of said second dielectric material to expose said top first portion of said second group of said set of fins.

12. The method of claim 7, wherein said bottom second portion of said first group of said set of fins have a same height as said bottom second portion of said second group of said set of fins.

13. A method comprising:
forming a set of fins on a substrate, said set of fins having a top first portion, a bottom second portion, and a middle third portion directly underneath said top first portion and directly above said bottom second portion;

oxidizing said middle third portion to create an oxide section in each of said set of fins, said oxide section comprising a first group thereof, having a first height and corresponding to a first group of said set of fins, and a second group thereof, having a second height and corresponding to a second group of said set of fins, said first height being higher than said second height; and applying said top first portion of said set of fins in forming one or more fin-type field-effect-transistors (FinFETs), wherein oxidizing said middle third portion comprises:
covering said top first portion of said set of fins with a first dielectric material;
covering said bottom second portion and said middle third portion of said set of fins with a second dielectric material;
recessing said second dielectric material to expose said middle third portion of said set of fins; and
subjecting said exposed middle third portion of said set of fins to an oxidizing environment, and
wherein covering said top first portion of said set of fins comprises:
covering top surfaces of said set of fins with a hard mask layer; and
forming spacers of said first dielectric material directly next to sidewalls of said top first portion of said set of fins that are not covered by said second dielectric material.

* * * * *